US012250821B2

(12) United States Patent
Hossain et al.

(10) Patent No.: US 12,250,821 B2
(45) Date of Patent: *Mar. 11, 2025

(54) ELECTRONIC DEVICES INCLUDING PILLARS IN ARRAY REGIONS AND NON-ARRAY REGIONS

(71) Applicant: Micron Technology, Inc., Boise, ID (US)

(72) Inventors: S M Istiaque Hossain, Boise, ID (US); Christopher J. Larsen, Boise, ID (US); Anilkumar Chandolu, Boise, ID (US); Wesley O. McKinsey, Nampa, ID (US); Tom J. John, Boise, ID (US); Arun Kumar Dhayalan, Boise, ID (US); Prakash Rau Mokhna Rau, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/391,442

(22) Filed: Dec. 20, 2023

(65) Prior Publication Data

US 2024/0130132 A1    Apr. 18, 2024

Related U.S. Application Data

(63) Continuation of application No. 17/806,829, filed on Jun. 14, 2022, now Pat. No. 11,871,575, which is a
(Continued)

(51) Int. Cl.
*H10B 43/35* (2023.01)
*H10B 41/27* (2023.01)
(Continued)

(52) U.S. Cl.
CPC ............. *H10B 43/35* (2023.02); *H10B 41/27* (2023.02); *H10B 41/35* (2023.02); *H10B 43/20* (2023.02)

(58) Field of Classification Search
CPC .......... H01L 27/1157; H01L 27/11565; H01L 27/11578; H01L 29/40117;
(Continued)

(56) References Cited

U.S. PATENT DOCUMENTS 7,157,771 B2   1/2007  Forbes
8,446,767 B2   5/2013  Tang et al.
(Continued)

FOREIGN PATENT DOCUMENTS

CN    108987407 A    12/2018
CN    106558590 A     3/2019
(Continued)

OTHER PUBLICATIONS

International Search Report for Application No. PCT/US2021/070187, mailed Jun. 29, 2021, 3 pages.
(Continued)

*Primary Examiner* — Khaja Ahmad
*Assistant Examiner* — Khatib A Rahman
(74) *Attorney, Agent, or Firm* — TraskBritt (57) ABSTRACT

An electronic device comprising a lower deck and an upper deck adjacent to a source. Each of the lower deck and the upper deck comprise tiers of alternating conductive materials and dielectric materials. Each of the lower deck and the upper deck also comprise an array region and one or more non-array regions. Memory pillars are in the lower deck and the upper deck of the array region and the memory pillars are configured to be operably coupled to the source. Dummy pillars are in the upper deck of the one or more non-array regions and the dummy pillars are configured to be electri-
(Continued)

cally isolated from the source. Another conductive material is in the upper deck and the lower deck of the one or more non-array regions. Additional electronic devices and related systems and methods of forming an electronic device are also disclosed.

20 Claims, 5 Drawing Sheets

Related U.S. Application Data continuation of application No. 16/851,638, filed on Apr. 17, 2020, now Pat. No. 11,387,245.

(51) Int. Cl.
*H10B 41/35* (2023.01)
*H10B 43/20* (2023.01)

(58) Field of Classification Search
CPC ......... H01L 27/11582; H01L 27/11524; H01L 27/11556; H01L 27/11573; H10B 43/35; H10B 41/27; H10B 41/35; H10B 43/20; H10B 43/27; H10B 43/10; H10B 43/40
See application file for complete search history.

(56) References Cited

U.S. PATENT DOCUMENTS

| | | | |
|---|---|---|---|
| 8,799,725 | B2 | 8/2014 | Roohparvar et al. |
| 8,951,865 | B2 | 2/2015 | Goda |
| 9,007,831 | B2 | 4/2015 | Sakui et al. |
| 9,147,681 | B2 | 9/2015 | Liu |
| 9,391,082 | B2 | 7/2016 | Sakui et al. |
| 9,431,421 | B2 | 8/2016 | Vu et al. |
| 9,437,304 | B2 | 9/2016 | Goda et al. |
| 9,698,156 | B2 | 7/2017 | Lue |
| 9,881,929 | B1 | 1/2018 | Ravikirthi et al. |
| 9,917,101 | B1* | 3/2018 | Konagai ........... H01L 27/11582 |
| 9,960,181 | B1 | 5/2018 | Cui et al. |
| 9,966,451 | B1 | 5/2018 | Lee |
| 10,283,520 | B2 | 5/2019 | Hopkins et al. |
| 10,344,398 | B2 | 7/2019 | Meldrim et al. |
| 10,522,559 | B2 | 12/2019 | Pekny |
| 10,580,795 | B1 | 3/2020 | Luo et al. |
| 10,600,763 | B1 | 3/2020 | Xiao |
| 10,700,078 | B1 | 6/2020 | Cui et al. |
| 11,232,839 | B1 | 1/2022 | Lee et al. |
| 2008/0242034 | A1 | 10/2008 | Mokhlesi et al. |
| 2014/0264533 | A1 | 9/2014 | Simsek-Ege et al. |
| 2016/0049419 | A1 | 2/2016 | Lee et al. |
| 2016/0343727 | A1 | 11/2016 | Kim et al. |
| 2017/0033117 | A1 | 2/2017 | Lee |
| 2017/0062454 | A1 | 3/2017 | Lu et al. |
| 2017/0179153 | A1 | 6/2017 | Ogawa et al. |
| 2017/0352677 | A1* | 12/2017 | Zhu ........................ H10B 99/00 |
| 2018/0122904 | A1 | 5/2018 | Matsumoto et al. |
| 2018/0358102 | A1 | 12/2018 | Zhang et al. |
| 2018/0374870 | A1 | 12/2018 | Ramaswamy et al. |
| 2019/0019540 | A1 | 1/2019 | Sakui |
| 2019/0067182 | A1* | 2/2019 | Lee ........................ H01L 21/762 |
| 2019/0067321 | A1* | 2/2019 | Song ........................ H10B 41/20 |
| 2019/0288002 | A1 | 9/2019 | Lu et al. |
| 2019/0294330 | A1 | 9/2019 | Zhao et al. |
| 2019/0304993 | A1 | 10/2019 | Lee et al. |
| 2019/0378857 | A1* | 12/2019 | Lee ................. H01L 27/11568 |
| 2020/0006376 | A1* | 1/2020 | Makala ............. H01L 29/40117 |
| 2020/0013801 | A1 | 1/2020 | Zhu et al. |
| 2020/0066346 | A1 | 2/2020 | Li et al. |
| 2020/0066739 | A1 | 2/2020 | Guo et al. |
| 2020/0075627 | A1 | 3/2020 | Ahn et al. |
| 2020/0083243 | A1 | 3/2020 | Fukushima et al. |
| 2020/0091166 | A1 | 3/2020 | Zhang et al. |
| 2020/0185405 | A1 | 6/2020 | Cui et al. |
| 2020/0258722 | A1 | 8/2020 | Natori et al. |
| 2020/0273876 | A1 | 8/2020 | Kashima et al. |
| 2020/0279868 | A1 | 9/2020 | Makala et al. |
| 2021/0091102 | A1* | 3/2021 | Zhu ................... H01L 21/76802 |
| 2021/0210505 | A1 | 7/2021 | Choi et al. |
| 2021/0375704 | A1 | 12/2021 | Harashima et al. |

FOREIGN PATENT DOCUMENTS

| | | | |
|---|---|---|---|
| JP | 2017-147337 | A | 8/2017 |
| JP | 2019-041061 | A | 3/2019 |
| JP | 2019-087748 | A | 6/2019 |
| JP | 2019-117894 | A | 7/2019 |
| JP | 2020-047350 | A | 3/2020 |
| TW | 201834147 | A | 9/2018 |
| WO | 2019/143400 | A1 | 7/2019 |

OTHER PUBLICATIONS

Micheloni et al., Architectural and Integration Options for 3D NAND Flash Memories, Computers, (2017), vol. 6, No. 27, 19 pages.
Taiwanese First Office Action for Application No. 110107564, issued Nov. 29, 2021, 15 pages.
Taiwanese Search Report and Office Action from Taiwanese Application No. 111136240, dated Jan. 7, 2023, 16 pages with English translation.
Written Opinion of the International Searching Authority for Application No. PCT/US2021/070187, mailed Jun. 29, 2021, 9 pages.
Japanese Notice of Reasons for Refusal for Japanese Application No. 2022-562605, dated Jan. 30, 2024, 13 pages with English translation.
Korean Notice of Reasons for Rejection for Korean Application No. 10-2022-7037598, dated Feb. 16, 2024, 14 pages with English translation.
Korean Notice of Final Rejection for Korean Application No. 10-2022-7037598, dated Oct. 7, 2024, 6 pages with English translation.

* cited by examiner

ELECTRONIC DEVICES INCLUDING PILLARS IN ARRAY REGIONS AND NON-ARRAY REGIONS

CROSS-REFERENCE TO RELATED APPLICATIONS

This application is a continuation of U.S. patent application Ser. No. 17/806,829, filed Jun. 14, 2022, now U.S. Pat. No. 11,871,575, issued Jan. 9, 2024, which is a continuation of U.S. patent application Ser. No. 16/851,638, filed Apr. 17, 2020, now U.S. Pat. No. 11,387,245, issued Jul. 12, 2022, the disclosure of each of which is hereby incorporated herein in its entirety by this reference.

TECHNICAL FIELD

Embodiments disclosed herein relate to electronic devices and electronic device fabrication. More particularly, embodiments of the disclosure relate to electronic devices including pillars in array regions and non-array regions, and to related electronic systems and methods.

BACKGROUND

Memory devices provide data storage for electronic systems. A Flash memory device is one of various memory device types and has numerous uses in modern computers and other electrical devices. A conventional Flash memory device includes a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional NAND (3D NAND) memory device, a type of vertical memory device, not only are the memory cells arranged in row and column fashion in a horizontal array, but tiers of the horizontal arrays are stacked (e.g., vertically stacked) over one another to provide a three-dimensional array of the memory cells. The tiers include alternating conductive materials with insulating (e.g., dielectric) materials. The conductive materials function as control gates for, e.g., access lines (e.g., word lines) of the memory cells. Vertical structures (e.g., pillars including channel regions) extend along the vertical string of the memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. 3D NAND memory devices also include electrical connections between, e.g., access lines (e.g., word lines) and other conductive structures of the device so that the memory cells of the vertical strings can be selected for writing, reading, and erasing operations. String drivers drive the access line (e.g., word line) voltages to write to or read from the memory cells of the vertical string.

As memory density increases in the 3D NAND memory devices, increased numbers of tiers (e.g., the number of alternating dielectric materials and conductive materials) are formed. However, as the numbers of tiers increases, pillar bending is observed in the 3D NAND memory devices.

DETAILED DESCRIPTION

An electronic device (e.g., an apparatus, a microelectronic device, a semiconductor device, a memory device) that includes multiple decks is disclosed, with pillars present in less than all portions of the decks of the electronic device. The pillars are present in an array region (e.g., an active region) of the electronic device and in upper decks of non-array regions (e.g., non-active regions, peripheral regions) of the electronic device. The pillars are not present in lower decks of the non-array regions of the electronic device. The pillars are present in the upper decks of the array region and the non-array regions of the electronic device. The pillars in the array region are configured as memory pillars (e.g., channel pillars) and the pillars in the non-array regions are configured as so-called "dummy pillars." The pillars in the upper decks of the non-array regions are proximal to contacts in the non-array regions. The pillars in the upper decks of the non-array regions provide reduced pillar bending to the array region of the electronic device containing the pillars. The pillars in the upper decks and the lower decks of the electronic device are asymmetrical in that no pillars are present in the lower decks of the non-array regions while pillars are present in the lower decks of the array regions.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms of the terms "a," "an," and "the" are intended to include the plural forms as well, unless the context clearly indicates otherwise.

As used herein, the term "and/or" includes any and all combinations of one or more of the associated listed items.

As used herein, the terms "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "array region" means and includes a region of an electronic device including memory cells of a memory array. The array region of the electronic device includes active circuitry.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., by way of another structure).

As used herein, the term "deck" means and includes multiple (e.g., two or more) tiers of alternating nitride materials and dielectric materials or alternating conductive materials and dielectric materials. Decks of the electronic device are vertically disposed relative to one another.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device includes of tiers of alternating conductive materials and dielectric materials.

As used herein, the term "electronic structure" means and includes a precursor structure to the electronic device, with tiers of alternating nitride materials and dielectric materials.

As used herein, the terms "horizontal" or "lateral" mean and include a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis and may be parallel to an indicated "X" axis and an indicated "Y" axis.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "non-array region" means and includes a region of the electronic device proximal to the array region.

As used herein, the term "selectively removable" means and includes a material that exhibits a greater removal rate responsive to process conditions, such as exposure to radiation (e.g., heat), relative to another material exposed to the same process conditions. A material that is selectively removable relative to another material is substantially completely removable without removing substantially any of the another material.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. The height of a respective material or feature (e.g., structure) may be defined as a dimension in a vertical plane.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., a microelectronic device, a semiconductor device, a memory device,) or the structures thereof (e.g., systems). The remainder of the process flow is known to those of ordinary skill in the art. Accordingly, only the methods and structures necessary to understand embodiments of the present apparatus and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art. Unless the context indicates otherwise, the removal of materials described herein may be accomplished by any suitable technique including, but not limited to, etching (e.g., dry etching, wet etching, vapor etching), ion milling, abrasive planarization, or other known methods.

Figure 1:
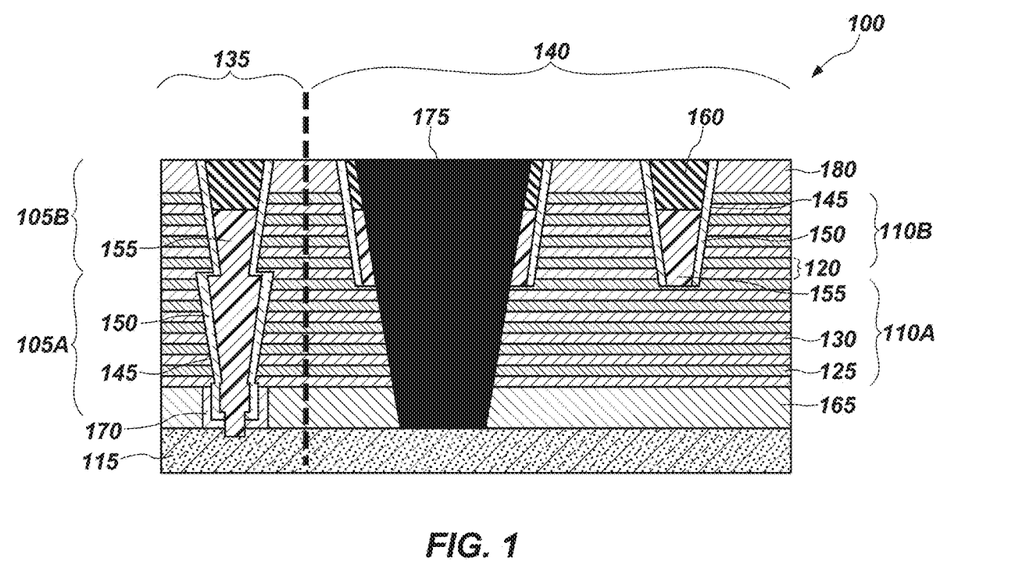
FIG. 1 is a cross-sectional view of an electronic structure including pillars in a lower deck and an upper deck according to embodiments of the disclosure.

An electronic structure 100 including pillars 105 in decks 110 adjacent to (e.g., vertically adjacent to, on) a substrate 115 (e.g., a base material) is shown in FIG. 1. The electronic structure 100 includes a lower deck 110A and an upper deck 110B, with each deck 110 including tiers 120 of alternating nitride materials 125 and dielectric materials 130. The lower deck 110A and the upper deck 110B are vertically adjacent to one another. While two decks 110A, 110B are illustrated in FIG. 1, the electronic structure 100 may include a greater number of decks 110. The lower deck 110A and the upper deck 110B may include the same number of tiers 120 as one another or a different number of tiers 120. While the electronic structure 100 in FIG. 1 includes nine tiers 120, more tiers 120 or less tiers 120 may be present. The lower deck 110A and the upper deck 110B may be separated from one another by an interdeck region (not shown). The nitride material 125 may, for example, be silicon nitride. As described below, the nitride material 125 is subsequently replaced with a conductive material by a so-called "replacement gate" process. The dielectric materials 130 may be an electrically insulative material including, but not limited to, a silicon oxide (e.g., silicon dioxide ($SiO_2$)), phosphosilicate glass, borosilicate glass, borophosphosilicate glass, fluorosilicate glass, or a combination thereof. In some embodiments, the dielectric material 130 is silicon dioxide. The dielectric material 130 may, for example, be configured to electrically isolate conductive materials 190 (see FIG. 4) of an electronic device 200.

The pillars 105 in the lower deck 110A are referred to herein as lower pillars 105A and the pillars 105 in the upper deck 110B are referred to herein as upper pillars 105B, while the term "pillars" 105 is used to collectively refer to the lower pillars 105A and the upper pillars 105B. The lower pillars 105A are present only in an array region 135 of the electronic structure 100. No lower pillars 105A are present in non-array regions 140 of the electronic structure 100. The upper pillars 105B are present in the array region 135 and in the non-array regions 140 of the electronic structure 100. The array region 135 of the electronic structure 100 includes the lower and upper pillars 105A, 105B and, therefore, includes pillars 105 in both the lower deck 110A and the upper deck 110B. The non-array regions 140 of the electronic structure 100 include the upper pillars 105B in the upper deck 110B, with no lower pillars in the lower deck 110A. Therefore, the non-array regions 140 include only the upper pillars 105B and are free of (e.g., substantially free of, lack) lower pillars 105A. The upper pillars 105B in the non-array regions 140 are proximal to contacts 175A (see FIG. 4). The non-array regions 140 of the electronic structure 100 include, but are not limited to, one or more of a periphery region, a plane separation region, a macro read only memory (MROM) region, an instruction read only memory (IROM) region, a bitline exit region, or a scribe region. The non-array regions 140 are illustrated schematically in FIG. 1 as being laterally adjacent to the array region 135. However, a portion of the non-array regions 140 may be below the substrate 115 or above the upper deck 110B. While not illustrated, complementary metal-oxide-semiconductor (CMOS) circuitry may, for example, be present below the substrate 115. The dashed line in FIG. 1 is used to indicate separation between the array region 135 and the one or more non-array regions 140 of the electronic structure 100.

The pillars 105 are formed in pillar openings 145 in the electronic structure 100. The pillar openings 145 are shown in FIG. 1 with various materials therein. The pillars 105A, 105B of the array region 135 extend from an upper surface of the upper deck 110B and into the substrate 115. The pillars 105A, 105B extend through the upper deck 110B, through the lower deck 110A, through source 165, and partially into the substrate 115 in the array region 135. The pillars 105B of the non-array regions 140 extend from the upper surface of the upper deck 110B and through the upper deck 110B. The pillars 105B of the non-array regions 140 may extend partially into the lower deck 110A. However, the pillars 105B of the non-array regions 140 do not extend through the lower deck 110A or into the source 165.

The pillars 105 in the lower deck 110A and in the upper deck 110B include a channel material and cell materials (shown collectively in FIG. 1 as cell film 150) on sidewalls of the tiers 120. The channel material may be polysilicon or other channel material as known in the art. The cell materials may be one or more of a dielectric material, a conductive material, etc. The cell material(s) may include one or more of an oxide material, a storage material, or a tunnel dielectric material as known in the art. By way of example only, the cell materials may include an oxide-nitride-oxide (ONO) structure having a dielectric material (e.g., a tunnel dielectric material), a charge trapping material, and a charge blocking material between the channel material and the dielectric materials 130 or the conductive materials 190 (see FIG. 4). The charge trapping material may be located directly between the dielectric material and the charge blocking material. In some embodiments, the dielectric material directly contacts the channel material and the charge trapping material. The charge blocking material may directly contact and may be located directly adjacent to the charge trapping material and the dielectric materials 130 or the conductive materials 190 (see FIG. 4). A fill material 155 is also present in the pillars 105A, 105B, separating opposing portions of the cell film 150 in the pillar openings 145.

In the array region 135, the cell film 150 of the pillars 105 extends from an upper surface of the upper deck 110B, through the upper deck 110B, through the lower deck 110A, and into the source 165. In the array region 135, the fill material 155 of the pillars 105 extends through a portion of the upper deck 110B, through the lower deck 110A, into the source 165, and into an upper portion of the substrate 115. In the non-array region 140, the cell film 150 of the pillars 105B extends from the upper surface of the upper deck 110B, through the upper deck 110B, and, optionally, into a portion of the lower deck 110A. In the non-array region 140, the fill material 155 of the pillars 105B extends through a portion of the upper deck 110B and, optionally, into a portion of the lower deck 110A.

The pillars 105B in the upper deck 110B also include a plug material 160. The plug material 160 is positioned over the fill material 155 of the upper pillars 105B. The plug material 160 may be one of the conductive materials previously described. The plug material 160 may be operably coupled (e.g., electrically connected) to other conductive materials of the electronic structure 100, such as being electrically connected to contacts (not shown) above the upper deck 110B. No plug material 160 is present in the lower pillars 105A. The pillars 105B in the array region 135 and the non-array regions 140 are substantially the same, except that the pillars 105B in the non-array regions 140 may, optionally, extend into the portion of the lower deck 110A.

The fill material 155 may be a dielectric material, such as a silicon oxide material (e.g., silicon dioxide, phosphosilicate glass, borosilicate glass, borophosphosilicate glass, fluorosilicate glass, or a combination thereof), a metal oxide material (e.g., titanium dioxide, hafnium oxide, zirconium dioxide, tantalum oxide, magnesium oxide, hafnium magnesium oxide, aluminum oxide, or a combination thereof), or a combination thereof. The fill material 155 may substantially completely fill the pillar openings 145 in which the pillars 105 are formed.

The electronic structure 100 also includes the source 165 adjacent to (e.g., vertically adjacent to, on) the substrate 115. The source 165 is formed of a conductive material (e.g., an electrically conductive material) including, but not limited to, a metal (e.g., tungsten, titanium, nickel, tantalum, cobalt, platinum, rhodium, ruthenium, iridium, aluminum, copper, molybdenum, silver, gold, or a combination thereof), a metal alloy, a metal-containing material (e.g., a metal nitride, a metal silicide, a metal carbide, a metal oxide), a material including at least one of titanium nitride (TiN), tantalum nitride (TaN), tungsten nitride (WN), titanium aluminum nitride (TiAlN), iridium oxide (IrO$_x$), ruthenium oxide (RUO$_x$), an alloy thereof, a conductively-doped semiconductor material (e.g., conductively-doped silicon, conductively-doped germanium, conductively-doped silicon germanium, etc.), polysilicon, other materials exhibiting electrical conductivity, or a combination thereof. In some embodiments, the source 165 is formed of doped polysilicon. In other embodiments, the source 165 is formed of tungsten silicide. The source 165 is operably coupled to the pillars 105A, 105B of the array region 135 and is electrically isolated from the pillars 105B of the non-array regions 140. The channel material of the cell film 150 is in electrical contact with the source 165. A barrier material 170 surrounds a portion of the lower pillar 105A that extends into the source 165, separating the source 165 and the cell film 150.

The electronic structure 100 also includes a conductive material 175 that extends from the upper surface of the upper deck 110B and through the source 165. The conductive material 175 extends through the upper deck 110B, through the lower deck 110A, and through the source 165. The conductive material 175 may be configured as a contact 175A (see FIG. 4) in an electronic device 200 formed from the electronic structure 100. The conductive material 175 may function, for example, as an interconnect to operably coupled (e.g., electrically couple, electrically connect) the source 165 and additional components connected thereto (e.g., conductive interconnects, conductive routing structures) to other components (e.g., additional components vertically above the upper deck 110B) of the electronic device produced from the microelectronic structure 100. By way of example only, the conductive material 175 electrically connects the source 165 to other electrically conductive components of the electronic device 200. The conductive material 175 may include, but is not limited to, one of the materials previously described for the source 165. In some embodiments, the conductive material 175 is tungsten.

The electronic structure 100 also includes an insulative material 180 adjacent to (e.g., vertically adjacent to, on) an uppermost tier 120 of the tiers 120. The insulative material 180 isolates (e.g., electrically isolates) adjacent plug materials 160 from one another. The insulative material also isolates (e.g., electrically isolates) other components (e.g., additional components vertically above the upper deck 110B) of the electronic device produced from the microelectronic structure 100.

Figure 5A:
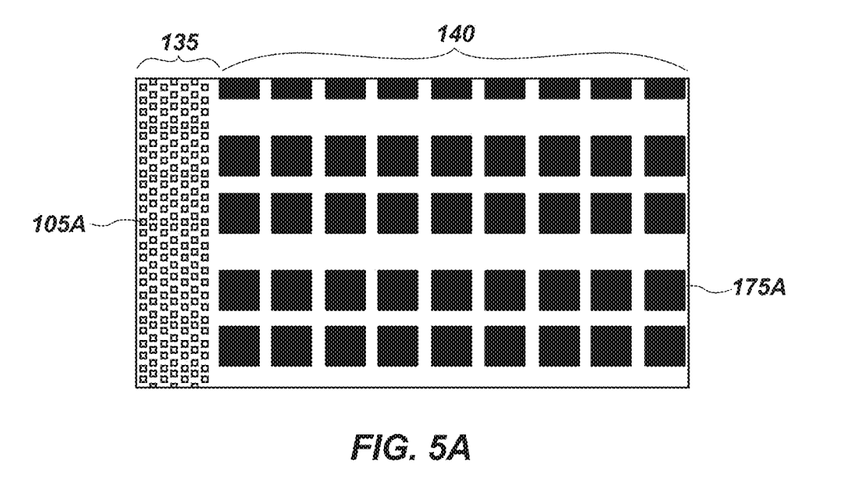
FIGS. 5A and 5B are top down views of the lower deck and the upper deck of the electronic device of FIG. 4.
Figure 5B:
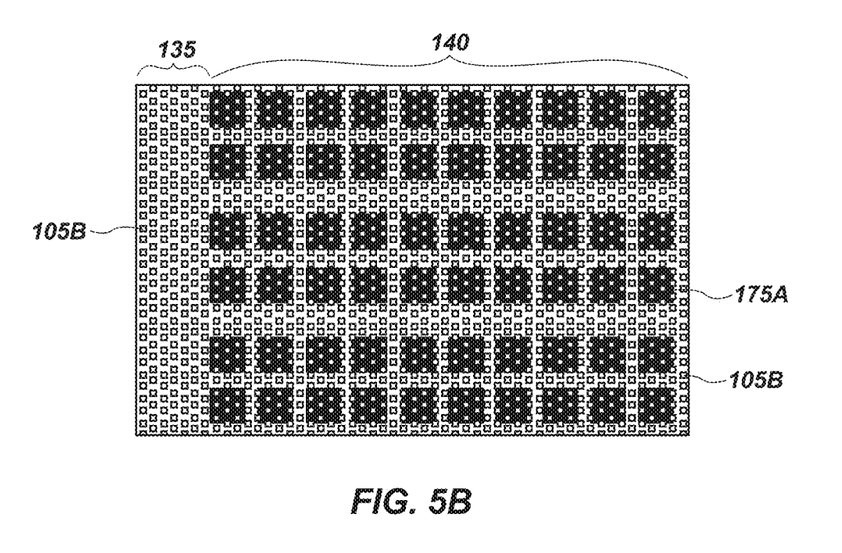

As shown in FIGS. 5A and 5B, the lower and upper pillars 105A, 105B are present in the array region 135 in both the lower deck 110A and the upper deck 110B, and only the upper pillars 105B are present in the upper deck 110B of the non-array regions 140. No lower pillars 105A are present in the lower deck 110A of the non-array regions 140, as shown most clearly in the top down view of FIG. 5A. The lower and upper pillars 105A, 105B in the array region 135 are the same pitch as the upper pillars 105B in the non-array regions 140 of the upper decks 110B, as shown most clearly in the top down view of FIG. 5B. The upper pillars 105B in the non-array regions 140 are proximal to contacts 175A, with portions of some of the upper pillars 105B on sidewalls of the contacts 175A. Multiple upper pillars 105B may surround (e.g., circumscribe, encircle) each of the contacts 175A. The close packing of the upper pillars 105B in the non-array regions 140 provides support to the upper pillars 105B in the array region 135, reducing pillar bending in the array region 135.

Accordingly, an electronic device is disclosed. The electronic device comprises a lower deck and an upper deck adjacent to a source. Each of the lower deck and the upper deck comprise tiers of alternating conductive materials and dielectric materials. Each of the lower deck and the upper deck also comprise an array region and one or more non-array regions. Memory pillars are in the lower deck and the upper deck of the array region and the memory pillars are configured to be operably coupled to the source. Dummy pillars are in the upper deck of the one or more non-array regions and the dummy pillars are configured to be electrically isolated from the source. Another conductive material is in the upper deck and the lower deck of the one or more non-array regions.

Accordingly, another electronic device is disclosed. The electronic device comprises memory pillars in an array region and multiple decks including alternating conductive materials and dielectric materials. The memory pillars are in a first deck and a second deck of the multiple decks. Dummy pillars are in the second deck of a non-array region of the electronic device and dummy pillars are lacking in the first deck. A source is below the first deck and is operably coupled to the memory pillars and electrically isolated from the dummy pillars. Another conductive material is in the first deck and the second deck of the one or more non-array region.

Figure 2:
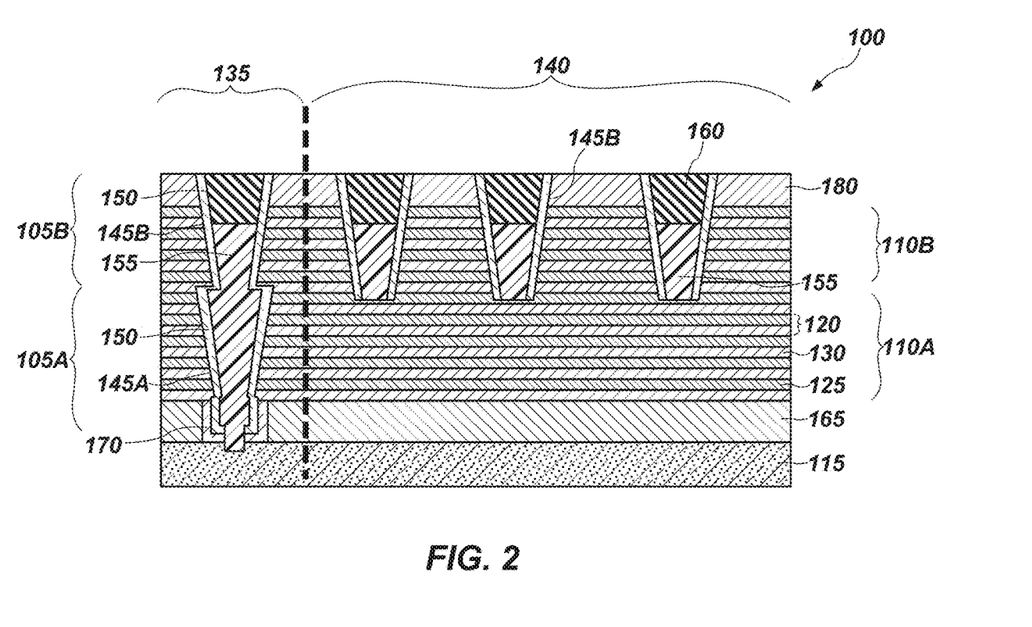
FIGS. 2 and 3 are cross-sectional views of the electronic structure at various stages of forming the electronic structure according to embodiments of the disclosure.

To form the electronic structure 100 of FIG. 1, a conductive material of the source 165 is formed adjacent to (e.g., on) the substrate 115, as shown in FIG. 2, which illustrates the electronic structure 100 at an initial processing stage of forming the electronic device 200. The source 165 is formed vertically adjacent to the substrate 115 by conventional techniques. The alternating nitride materials 125 and dielectric materials 130 of the tiers 120 of the lower deck 110A are formed adjacent to (e.g., vertically adjacent to, on) the source 165 by conventional techniques. After forming the desired number of tiers 120, the alternating nitride materials 125 and dielectric materials 130 of the lower deck 110A are patterned to form lower pillar openings 145A in the array region 135 of the lower deck 110A, into which the channel material and the cell materials of the lower pillars 105A are formed. The lower pillar openings 145A extend through the lower deck 110A and into the source 165 and, optionally, into the substrate 115. The lower pillar openings 145A may be formed by removing materials of the tiers 120, the source 165, and the substrate 115 by conventional techniques. One or more etch processes may be conducted to form the lower pillar openings 145A. No similar openings are formed in the non-array regions 140 of the lower deck 110A. Therefore, the non-array regions 140 of the lower deck 110A lack (e.g., do not include) lower pillar openings 145 or lower pillars 105A. The lower pillars 105A are selectively formed in the array region 135 by conventional photolithography techniques. The channel material and the cell materials are conformally formed on sidewalls of the tiers 120 and the fill material 155 is formed in the remaining portions of the lower pillar openings 145A, forming the lower pillars 105A. The fill material 155 substantially completely fills the lower pillar openings 145A.

The alternating nitride materials 125 and dielectric materials 130 of the tiers 120 of the upper deck 110B are formed adjacent to (e.g., vertically adjacent to on) the lower deck 110A. The lower deck 110A and the upper deck 110B may include the same number of tiers 120 as one another or a different number of tiers 120. Upper pillar openings 145B are formed in the array region 135 and the non-array regions 140 by conventional techniques. The upper pillar openings 145B in the array region 135 and the non-array regions 140 of the upper deck 110B are formed at substantially the same time. Therefore, the upper pillar openings 145B extend through the upper deck 110B to substantially the same depth in both the array region 135 and the non-array regions 140. However, depending on the materials used in the tiers 120 and the etch conditions used to form the upper pillar openings 145B, the upper pillar openings 145B in the non-array regions 140 may extend into a portion of the lower deck 110A. The upper pillar openings 145B are formed in the upper deck 110B substantially on pitch. The channel material, the cell materials, and the plug material 160 are formed in the upper pillar openings 145B to form the upper pillars 105B in the array region 135 and in the non-array regions 140. The upper pillars 105B are formed in the upper deck 110B substantially on pitch. The channel material and the cell materials are formed in the upper pillar openings 145B as described above for the lower pillars 105A. The channel material and the cell materials are conformally formed on sidewalls of the tiers 120 and the fill material 155 is formed in the remaining portions of the upper pillar openings 145B. A portion of the fill material 155 is removed, recessing an upper surface of the fill material 155. The plug material 160 is formed over the fill material 155 and within the upper pillar openings 145B. Excess plug material 160 may be removed by conventional techniques such that an upper surface of the plug material 160 is substantially coplanar with the upper surface of the upper deck 110B.

The upper pillars 105B in the array region 135 are substantially aligned (e.g., stacked) with the lower pillars 105A in the array region 135. The locations of some of the upper pillars 105B in the non-array regions 140 correspond to locations where contacts 175A (see FIG. 4) are ultimately to be formed in the electronic device 200. Since no pillars are below the upper pillars 105B in the non-array regions 140, the upper pillars 105B are not stacked over features in the lower deck 110A. Instead, the upper pillars 105B in the non-array regions 140 are formed over the tiers 120 of the lower deck 110A. The upper pillars 105B in the non-array regions 140 are, therefore, configured as so-called "dummy pillars" that do not operably couple (e.g., electrically connect) with the source 165. The upper pillars 105B in the non-array regions 140 provide support to the pillars 105A, 105B in the array region 135. For example, the upper pillars 105B in the non-array regions 140 provide mechanical integrity and support to the upper pillars 105B in the array region 135. By including the upper pillars 105B in the non-array regions 140, the pillars 105 in the array region 135 exhibit substantially less bending than pillars in conventional electronic devices. The upper pillars 105B in the non-array regions 140 reduce or substantially prevent the upper pillars 105B in the array region 135 from bending.

Figure 3:
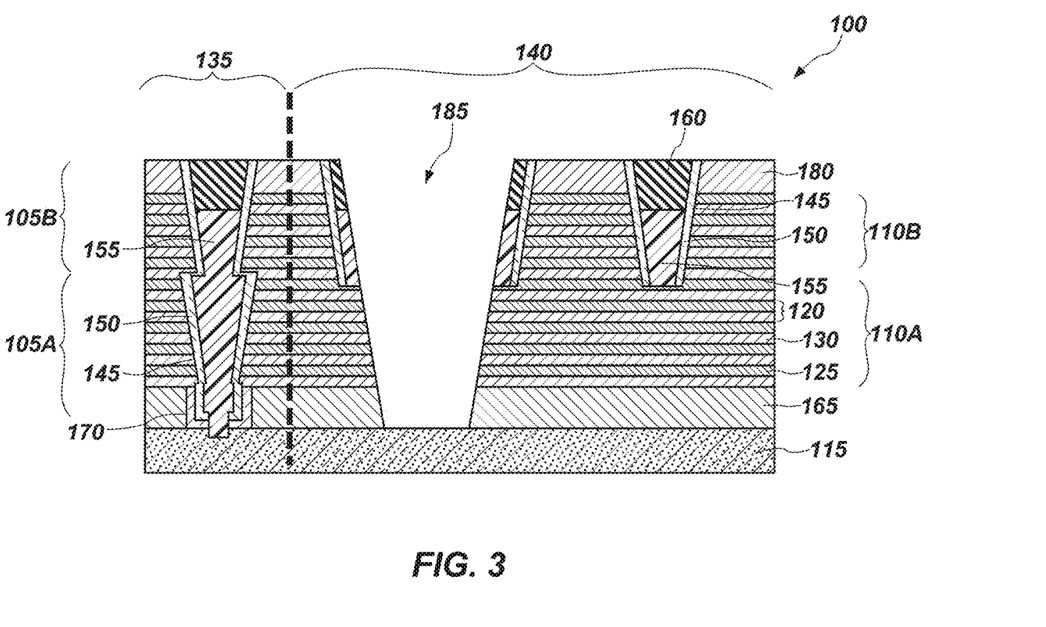

A void 185 is formed in the non-array regions 140 and extends through the upper deck 110B and the lower deck 110A and into the source 165, as shown in FIG. 3. The void 185 is formed by removing a portion of the plug material 160 and the fill material 155 underlying the plug material 160, as well as removing underlying portions of the alternating nitride materials 125 and dielectric materials 130 between adjacent upper pillars 105B of the upper deck 110B. Underlying portions of the nitride materials 125 and dielectric materials 130 in the lower deck 110A are also removed. The plug material 160, the fill material 155, the nitride materials 125 and dielectric materials 130 in the upper deck 110B, and the nitride materials 125 and dielectric materials 130 in the lower deck 110A may be removed by conventional techniques. A single etch process may be used to form the void 185 or multiple etch processes may be used. The conductive material 175 may be formed in the void 185, forming contacts of the electronic structure 100.

Figure 4:
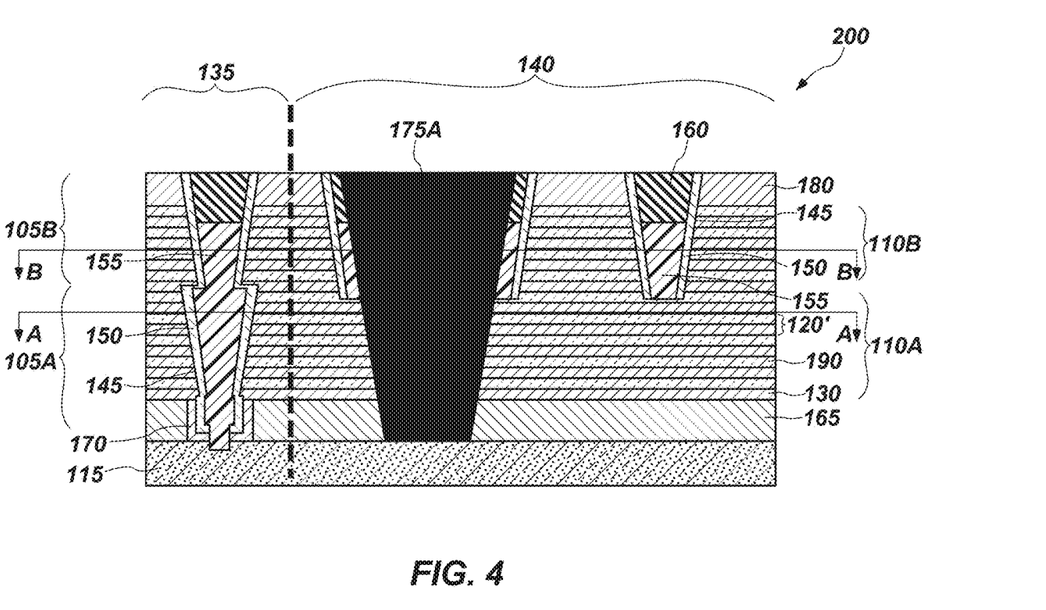
FIG. 4 is a cross-sectional view of an electronic device including the pillars in the lower deck and the upper deck according to embodiments of the disclosure.

The nitride materials 125 of the tiers 120 of the electronic structure 100 are replaced with the conductive materials 190 to form an electronic device 200 containing the pillars 105, the decks 110, the conductive materials 190, the dielectric materials 130, the cell films 150, the plug material 160, the conductive material 175 (configured as contacts 175A), the source 165, the barrier material 170, and the substrate 115, as shown in FIG. 4. The nitride materials 125 are replaced by a replacement gate process, where the nitride materials 125 of the tiers 120 are selectively etchable relative to the dielectric material 130 of the tiers 120. After removing the nitride materials 125, the conductive materials 190 are formed in spaces (not shown) between the dielectric materials 130. The electronic device 200 includes the tiers 120' of alternating conductive materials 190 and dielectric materials 130, with the conductive materials 190 in locations previously occupied by the nitride materials 125 of the tiers 120. Relative positions of the pillars 105, the decks 110, the cell films 150, the plug material 160, the contacts 175A, the source 165, the barrier material 170, and the substrate 115 of the electronic device 200 are as discussed above for the electronic structure 100.

The conductive materials 190 of the tiers 120' may be an electrically conductive material including, but not limited to, tungsten, aluminum, copper, titanium, tantalum, platinum, alloys thereof, heavily doped semiconductor material, polysilicon, a conductive silicide, a conductive nitride, a conductive carbon, a conductive carbide, or a combination thereof. In some embodiments, the conductive material 190 is tungsten. The conductive materials 190 of the tiers 120' may, for example, be configured as access lines (e.g., word lines, gates) (not shown) of the electronic device 200 upon which electrically conductive contact structures (e.g., contacts) are positioned to provide electrical access to other components of the electronic device 200. The electronic device 200, according to embodiments of the disclosure, includes multiple memory cells. Intersections between the conductive materials 190 of the tiers 120' and the channel material of the pillars 105A, 105B in the array region 135 define each memory cell and the pillars 105A, 105B in the array region 135 comprise strings of memory cells. The dielectric materials 130 of the tiers 120' may be positioned between the channel materials and the conductive materials 190 of the tiers 120'. Additional processing acts are conducted by conventional techniques to form the electronic device 200 from the electronic structure 100. By way of example only, one or more other conductive materials (e.g., electrically conductive materials) (not shown) may be operably coupled to (e.g., electrically coupled to, electrically connected to) one or more of the conductive materials 190, the source 165, or the contacts 175A. The conductive material may, for example, overlie and contact the plug material 160 and the contacts 175A. The other conductive material may be configured, for example, as a data line (e.g., a bit line, select line) and may be formed by conventional techniques to electrically couple to (e.g., electrically connect to) the source 165. One or more other conductive materials (e.g., electrically conductive materials) (not shown) may be electrically coupled to (e.g., electrically connected to) the source 165.

Accordingly, a method of forming an electronic device is disclosed. The method of claim comprises forming a lower deck comprising tiers of alternating nitride materials and dielectric materials. The lower deck comprises an array region and one or more non-array regions. Pillar openings are formed in the array region of the lower deck without forming the pillar openings in the one or more non-array regions of the lower deck. Cell film materials are formed in the pillar openings in the array region of the lower deck. An upper deck is formed and comprises tiers of alternating nitride materials and dielectric materials adjacent to the lower deck. The upper deck comprising an array region and one or more non-array regions. Pillar openings are formed in the array region and in the one or more non-array regions of the upper deck. Cell film materials are formed in the pillar openings in the array region and in the one or more non-array regions of the upper deck. The cell film materials in the array region of the upper deck overlie the cell film materials in the array region of the lower deck. The cell film materials in the one or more non-array regions of the upper deck overlie the tiers of alternating nitride materials and dielectric materials in the one or more non-array region of the lower deck. Voids are formed in the one or more non-array regions of the upper deck and of the lower deck and a conductive material is formed in the voids. The nitride materials of the tiers are removed to form spaces between the dielectric materials of the tiers. Another conductive material is formed in the spaces.

Accordingly, another method of forming an electronic device is disclosed. The method comprises forming an electronic structure comprising a lower deck and an upper deck. Each of the lower deck and the upper deck comprise tiers of alternating nitride materials and dielectric materials. Memory pillars are formed in the upper deck and in the lower deck of an array region of the electronic structure. Dummy pillars are formed in the upper deck of a non-array region of the electronic structure. A portion of the dummy pillars, a portion of the alternating nitride materials and dielectric materials in the upper deck, and a portion of the alternating nitride materials and dielectric materials in the lower deck is removed from the non-array region to form voids. The voids extend from an upper surface of the upper deck of the non-array region and into a source underlying the lower deck. A conductive material is formed in the voids. The nitride materials of the tiers are removed to form spaces between the dielectric materials. Another conductive material is formed in the spaces between the dielectric materials.

Since the pillars 105B in the upper decks 110B of the non-array regions 140 reduce or substantially eliminate pillar bending in the array regions 135, decks 110 with increased numbers of tiers 120, 120' may be formed without the occurrence of increased bending of the upper and lower pillars 105B, 105A in the array region 135. The improved pillar bending is achieved even in portions of the die where transitions in pillar numbers occur between the array regions 135 and non-array regions 140. Since pillar bending is reduced or eliminated, overlay between the upper and lower pillars 105B, 105A in the array region 135 may be improved. In addition, contacts formed above the upper decks 110B may be properly overlaid with the upper and lower pillars 105B, 105A in the array region 135. The electronic device 200 according to embodiments of the disclosure may also be formed with fewer and less complex process acts than conventional electronic devices. By way of example only, removal acts to form the voids 185 remove only insubstantial portions of the source 165, reducing shorting. Additionally, since the lower pillars 105A are only present in the array region 135, reduced or eliminated parasitic electrical channels and shorting in the non-array regions 140 are observed. In contrast, the process acts used to form conventional electronic devices result in the formation of voids that affect removal acts during patterning of the alternating nitride materials and dielectric materials. The voids produced during the process acts used to form the conventional electronic devices undesirably remove material of the source, which causes undesirable removal of the material of the source. The process acts used to form conventional electronic devices also result in overlay problems between upper and lower pillars since the upper pillars are commonly bent.

Figure 6:
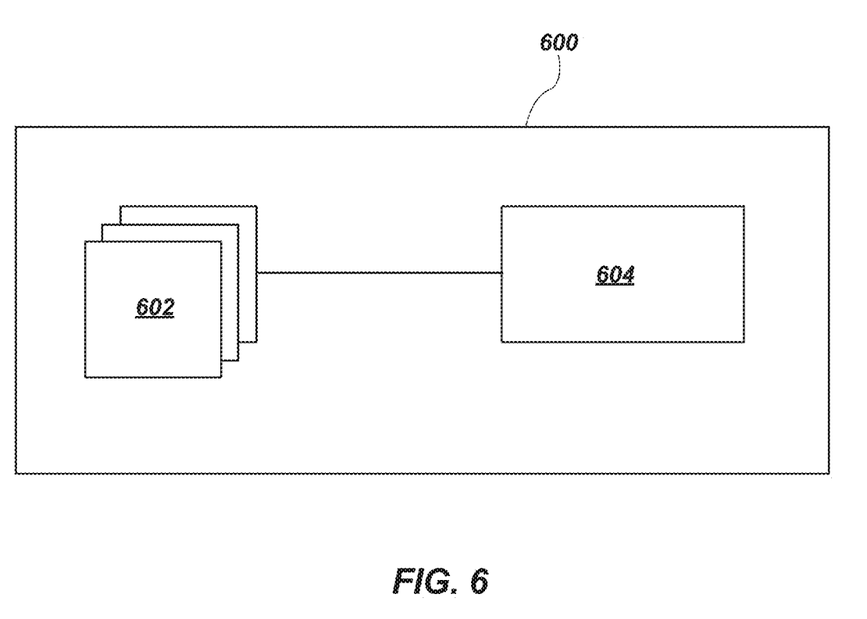
FIG. 6 is a block diagram of a memory array including one or more electronic devices according to embodiments of the disclosure.

Additional processing acts are also conducted to form a memory array or system containing one or more electronic devices 200. The electronic device 200 may be present in a memory array 600, as shown schematically in FIG. 6. The memory array 600 includes memory cells 602 and a control logic component 604. The control logic component 604 may be configured to operatively interact with the memory cells 602 so as to read, write, or re-fresh any or all memory cells within the memory array of memory cells 602. The memory cells 602 of the memory array 600 are coupled to access lines, and the access lines are coupled to word lines (e.g., conductive materials 190) of the memory cells 602. A string of memory cells of the memory array 600 is coupled in series between a source line and a data line (e.g., a bit line). The memory cells are positioned between the access lines and the data lines. The access lines may be in electrical contact with, for example, the conductive materials 190 of the electronic device 200, and the data lines may be in electrical contact with an electrode (e.g., a top electrode) of the electronic device 200. The data lines may directly overlie a row or column of the memory cells and contact the top electrode thereof. Each of the access lines may extend in a first direction and may connect a row of the memory cells. Each of the data lines may extend in a second direction that is at least substantially perpendicular to the first direction and may connect a column of the memory cells. A voltage applied to the access lines and the data lines may be controlled such that an electric field may be selectively applied at an intersection of at least one access line and at least one bit line, enabling the memory cells to be selectively operated. Additional process acts to form the memory array 600 including the one or more electronic devices 200 are conducted by conventional techniques.

Figure 7:
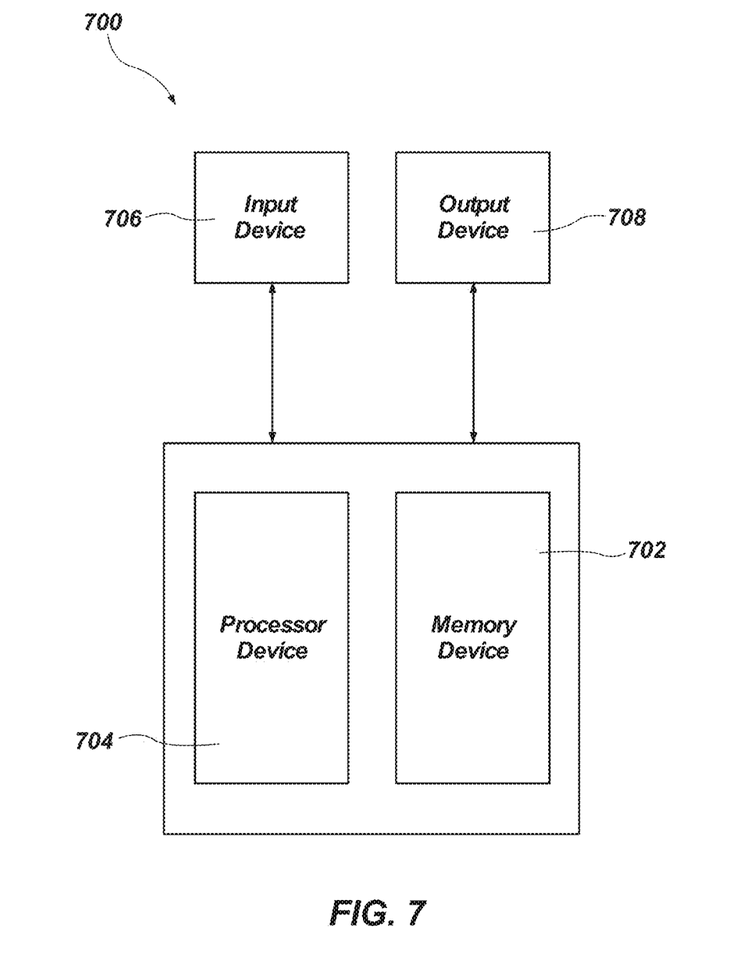
FIG. 7 is a block diagram of a system including one or more of the electronic devices according to embodiments of the disclosure.

FIG. 7 is a block diagram of a system 700 (e.g., an electronic system) implemented according to one or more embodiments described herein. The system 700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The system 700 includes at least one memory device 702, which includes one or more electronic devices 200 as previously described. The system 700 may further include at least one processor 704, such as a microprocessor, to control the processing of system functions and requests in the system 700. The processor 704 and other subcomponents of the system 700 may include the memory cells. The processor 704 may, optionally, include one or more memory arrays 600 as previously described.

Various other devices may be coupled to the processor 704 depending on the functions that the system 700 performs. For example, an input device 706 may be coupled to the processor 704 for inputting information into the electronic system 700 by a user, such as, for example, a mouse or other pointing device, a button, a switch, a keyboard, a touchpad, a light pen, a digitizer and stylus, a touch screen, a voice recognition system, a microphone, a control panel, or a combination thereof. An output device 708 for outputting information (e.g., visual or audio output) to a user may also be coupled to the processor 704. The output device 708 may include an LCD display, an SED display, a CRT display, a DLP display, a plasma display, an OLED display, an LED display, a three-dimensional projection, an audio display, or a combination thereof. The output device 708 may also include a printer, an audio output jack, a speaker, etc. In some embodiments, the input device 706 and the output device 708 may comprise a single touchscreen device that can be used both to input information to the electronic system 700 and to output visual information to a user. The one or more input devices 706 and output devices 708 may communicate electrically with at least one of the memory device 702 and the processor 704. The at least one memory device 702 and processor 704 may also be used in a system on chip (SoC).

The electronic device 200 according to embodiments of the disclosure may include, but is not limited to, a 3D electronic device, such as a 3D NAND Flash memory device, such as a multideck 3D NAND Flash memory device. The electronic device 200 formed according to embodiments of the disclosure may be used in any 3D electronic device where reduced or eliminated pillar bending is desired.

Accordingly, a system comprising an input device, an output device, a processor device, and a memory device is disclosed. The memory device comprises an array region and one or more non-array regions. Upper pillars are in an upper deck of the array region and of the one or more non-array regions. Lower pillars are in only a lower deck of the array region. A conductive material is in the upper deck and in the lower deck of the one or more non-array regions. The processor device is operably coupled to the input device and the output device and the memory device is operably coupled to the processor device.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
   two or more decks adjacent to a source, the two or more decks comprising an array region and one or more non-array regions and comprising:
      memory pillars in at least a lower deck and an upper deck of the two or more decks of the array region, the memory pillars extending from the upper deck to the source; and
      dummy pillars in the upper deck of the one or more non-array regions, the lower deck of the one or more non-array regions lacking dummy pillars.

2. The electronic device of claim 1, wherein the memory pillars in the upper deck and in the lower deck of the array region are substantially aligned.

3. The electronic device of claim 1, wherein the memory pillars in the upper deck and the lower deck of the array region are asymmetrically positioned relative to the dummy pillars of the one or more non-array regions.

4. The electronic device of claim 1, wherein the memory pillars comprise a channel material and a cell film.

5. The electronic device of claim 1, wherein the one or more non-array regions comprise contacts extending between the upper deck, the lower deck, and the source.

6. The electronic device of claim 5, wherein portions of the dummy pillars are on sidewalls of the contacts.

7. The electronic device of claim 5, wherein multiple dummy pillars in the one or more non-array regions circumscribe a contact.

8. The electronic device of claim 1, wherein the memory pillars extend substantially continuously through the upper deck and the lower deck and into the source.

9. An electronic device, comprising,
   a multideck structure comprising a three-dimensional array of memory cells in an array region and one or more non-array regions adjacent to the array region, the array region and the one or more non-array regions comprising at least two decks of tiers of alternating conductive materials and insulating materials adjacent to a source, the at least two decks comprising:
      memory pillars in at least an upper deck and a lower deck of the at least two decks of the array region; and
      dummy pillars in the upper deck of the at least two decks of the one or more non-array regions, the dummy pillars electrically isolated from the source.

10. The electronic device of claim 9, wherein the memory pillars in the array region and the dummy pillars in the one or more non-array regions are asymmetrical.

11. The electronic device of claim 9, wherein the dummy pillars in the one or more non-array regions are over the lower deck.

12. The electronic device of claim 9, wherein the memory pillars are configured as control gates of the electronic device.

13. The electronic device of claim 9, wherein the memory pillars extend through the upper deck, through the lower deck, and into the source.

14. The electronic device of claim 9, wherein a quantity of the dummy pillars in the one or more non-array regions is relatively greater than a quantity of the memory pillars in the array region.

15. The electronic device of claim 9, wherein a portion of the one or more non-array regions is below the source.

16. The electronic device of claim 9, wherein a portion of the one or more non-array regions is above the upper deck.

17. An electronic device, comprising,
   a multideck structure comprising an array region and one or more non-array regions, the array region comprising strings of memory cells extending through upper decks and lower decks of the array region to a source, and the one or more non-array regions comprising dummy pillars in the upper decks of the one or more non-array regions, contacts extending through upper decks and lower decks of the one or more non-array regions, and substantially no dummy pillars in the lower decks of the one or more non-array regions.

18. The electronic device of claim 17, wherein the strings of memory cells are coupled to access lines, and the access lines are coupled to word lines.

19. The electronic device of claim 17, wherein the strings of memory cells in the array region and the dummy pillars in the one or more non-array regions exhibit substantially the same pitch.

20. The electronic device of claim 17, wherein the dummy pillars extend partially into the lower decks of the one or more non-array regions.

* * * * *